(12) United States Patent
Afzali-Ardakani et al.

(10) Patent No.: US 10,256,405 B2
(45) Date of Patent: Apr. 9, 2019

(54) METHODS FOR FABRICATING ARTIFICIAL NEURAL NETWORKS (ANN) BASED ON DOPED SEMICONDUCTOR ELEMENTS

(71) Applicant: International Business Machines Corporation, Armonk, NY (US)

(72) Inventors: Ali Afzali-Ardakani, Ossining, NY (US); Matthew Warren Copel, Yorktown Heights, NY (US); James Bowler Hannon, Lake Lincolndale, NY (US); Satoshi Oida, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/479,876

(22) Filed: Apr. 5, 2017

(65) Prior Publication Data

US 2018/0294410 A1    Oct. 11, 2018

(51) Int. Cl.
*H01L 45/00* (2006.01)
*G06N 3/04* (2006.01)

(52) U.S. Cl.
CPC .......... *H01L 45/1641* (2013.01); *G06N 3/04* (2013.01)

(58) Field of Classification Search
CPC ..... H01L 21/0257; H01L 21/22; H01L 21/38; H01L 21/26513; H01L 21/26546; H01L 21/223; H01L 21/383; G06N 3/06; G06N 3/063; G06N 5/04; G06N 5/02; C30B 31/00
See application file for complete search history.

(56) References Cited

U.S. PATENT DOCUMENTS

| | | |
|---|---|---|
| 5,602,965 A | 2/1997 | Fu |
| 7,034,332 B2 | 4/2006 | Stasiak et al. |
| 8,183,553 B2 | 5/2012 | Phatak et al. |
| 8,466,035 B2 | 6/2013 | Pollard et al. |
| 8,614,432 B2 | 12/2013 | Pickett et al. |
| 8,691,675 B2 | 4/2014 | Afzali-Ardakani et al. |
| 8,853,008 B1 | 10/2014 | Lee |
| 9,202,693 B2 | 12/2015 | Wang et al. |
| 2009/0014707 A1 | 1/2009 | Lu et al. |
| 2009/0327188 A1* | 12/2009 | Ryhanen ............ G06K 9/00986 706/46 |

OTHER PUBLICATIONS

J.C. Ho et al., "Controlled Nanoscale Doping of Semiconductors Via Molecular Monolayers," Nature Materials, vol. 7, No. 1, 2008, pp. 62-67.
R. A. Puglisi et al., "A Comprehensive Study on the Physicochemical and Electrical Properties of Si Doped with the Molecular Doping Method," Physica Status Solidi (a), vol. 212, No. 8, 2015, pp. 1685-1694.
Elliot J. Fuller et al., "Li-Ion Synaptic Transistor for Low Power Analog Computing", wileyonlinelibrary.com, Advanced Materials, Nov. 22, 2016.

* cited by examiner

*Primary Examiner* — Sonya D. McCall-Shepard
(74) *Attorney, Agent, or Firm* — Vazken Alexanian; McGinn IP Law Group, PLLC

(57) ABSTRACT

A method of forming semiconductor elements in an artificial neural network, the method including forming a substrate including an oxide layer, forming a Silicon layer on the oxide layer, depositing a thin film dopant layer on the Silicon layer, and controlling a concentration of the dopant in the thin film dopant layer.

20 Claims, 16 Drawing Sheets

METHODS FOR FABRICATING ARTIFICIAL NEURAL NETWORKS (ANN) BASED ON DOPED SEMICONDUCTOR ELEMENTS

BACKGROUND OF THE INVENTION

Field of the Invention

The present invention relates generally to a method and apparatus for artificial neural network, and more particularly, but not by way of limitation, relating to a method, system, and apparatus for fabricating artificial neural networks (ANN) based on doped semiconductor elements.

Description of the Related Art

An artificial neural network (ANN) is a network based on biological neural networks which are used to approximate functions that can depend on known inputs. Artificial neural networks can see the nodes as 'artificial neurons'. An artificial neuron is a computational model inspired in the natural neurons. Natural neurons receive signals through synapses located on the dendrites or membrane of the neuron. When the signals received are strong enough (surpass a certain threshold), the neuron is activated and emits a signal though the axon. This signal might be sent to another synapse, and might activate other neurons.

Novel nano-electronic device concepts based on non-volatile memory (NVM) technologies, such as phase change memory (PCM) and resistive random access memory (RRAM), have been explored recently for implementing neural networks with a learning rule inspired by spike-timing-dependent plasticity (STDP) observed in biological systems. All of approaches using previously developed memory technologies looks very promising, however the estimated acceleration factors are limited by device specifications intrinsic to their application as NVM cells.

While there has been electronic devices used for artificial neural networks, there is a need to use a more effective and flexible means of providing and programming the artificial neural networks. Programming the resistances in artificial neural networks (ANNs) is a difficult task and there is a need provide an easy and efficient method of programming the resistances.

SUMMARY OF INVENTION

In view of the foregoing and other problems, disadvantages, and drawbacks of the aforementioned background art, an exemplary aspect of the present invention provides a system, apparatus, and method of providing a method, system, and apparatus for fabricating artificial neural networks (ANN) based on doped semiconductor elements.

One exemplary aspect of the present invention provides method of forming semiconductor elements in an artificial neural network, the method including forming a Silicon layer on an oxide layer, depositing a thin film dopant layer on a Silicon layer; and controlling a concentration of the dopant in the thin film dopant layer.

In another exemplary aspect of present invention, there is described resistive element in an artificial neural network, the resistive element, including an oxide layer, and a Silicon layer formed on the oxide layer, wherein the Silicon layer has dopants from a thin film dopant layer driven into the Silicon layer, and wherein the thin film dopant layer includes at least one of Boron and Phosphorus.

In yet another exemplary aspect of present invention, there is described method of forming resistive elements, the method including forming a plurality of resistive elements in an array, each of the resistive element formed by a method including forming a Silicon layer on an oxide layer, depositing a thin film dopant layer on a Silicon layer, and controlling a concentration of the dopant in the thin film dopant layer.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

BRIEF DESCRIPTION OF DRAWINGS

The exemplary aspects of the invention will be better understood from the following detailed description of the exemplary embodiments of the invention with reference to the drawings.

DETAILED DESCRIPTION OF PREFERRED EMBODIMENTS

Figure 1:
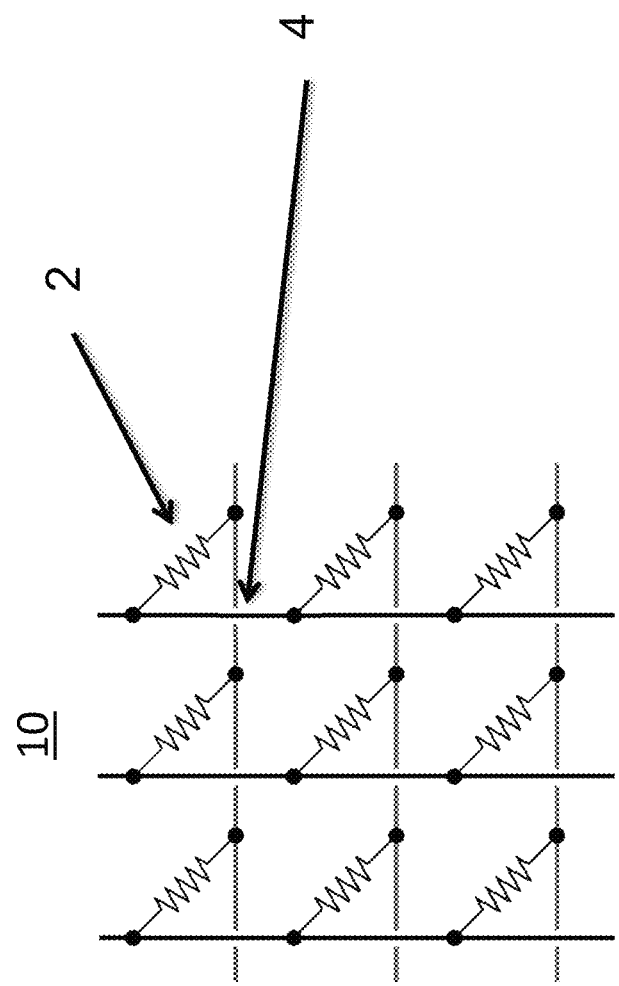
FIG. 1 illustrates a cross point array of the present invention.

The invention will now be described with reference to the drawing figures, in which like reference numerals refer to like parts throughout. It is emphasized that, according to common practice, the various features of the drawing are not necessary to scale. On the contrary, the dimensions of the various features can be arbitrarily expanded or reduced for clarity. Exemplary embodiments are provided below for illustration purposes and do not limit the claims.

An artificial neural network (ANN) is a network based on biological neural networks which are used to approximate functions that can depend on known inputs. Artificial neural networks can see the nodes as 'artificial neurons'. An artificial neuron is a computational model inspired in the natural neurons. Natural neurons receive signals through synapses located on the dendrites or membrane of the neuron. When the signals received are strong enough (surpass a certain threshold), the neuron is activated and emits a signal though the axon. This signal might be sent to another synapse, and might activate other neurons.

A deep neural network (DNN) is an artificial neural network (ANN) with multiple hidden layers of units between the input and output layers. Deep Neural Networks (DNNs) demonstrated significant commercial success in the last years with performance exceeding sophisticated prior methods in speech and object recognition. However, training the DNNs is an extremely computationally intensive task that requires massive computational resources and enormous training time that hinders their further application. For example, a 70% relative improvement has been demonstrated for a DNN with 1 billion connections that was trained on a cluster with 1000 machines for three days. Training the DNNs relies in general on the backpropagation algorithm that is intrinsically local and parallel. Various hardware approaches to accelerate DNN training that are exploiting this locality and parallelism have been explored with a different level of success starting from the early 90s to current developments with GPU, FPGA or specially designed ASIC. Further acceleration is possible by fully utilizing the locality and parallelism of the algorithm. For a fully connected DNN layer that maps neurons to neurons significant acceleration can be achieved by minimizing data movement using local storage and processing of the weight values on the same node and connecting nodes together into a massive systolic array where the whole DNN can fit in. Instead of a usual time complexity, the problem can be reduced therefore to a constant time independent of the array size. However, the addressable problem size is limited to the number of nodes in the array that is challenging to scale up to billions even with the most advanced CMOS technologies. Novel nano-electronic device concepts based on non-volatile memory (NVM) technologies, such as phase change memory (PCM) and resistive random access memory (RRAM), have been explored recently for implementing neural networks with a learning rule inspired by spike-timing-dependent plasticity (STDP) observed in biological systems.

Only recently, their implementation for acceleration of DNN training using backpropagation algorithm have been considered with reported acceleration factors ranging from 27× to 900×, and even 2140× and significant reduction in power and area. All of these bottom-up approach of using previously developed memory technologies looks very promising, however the estimated acceleration factors are limited by device specifications intrinsic to their application as NVM cells.

Device characteristics usually considered beneficial or irrelevant for memory applications such as high on/off ratio, digital bit-wise storage, and asymmetrical set and reset operations, are becoming limitations for acceleration of DNN training. These non-ideal device characteristics can potentially be compensated with a proper design of peripheral circuits and a whole system, but only partially and with a cost of significantly increased operational time.

Specialized kind of hardware is faster than regular computers. This is one of only ways to make transistors faster. One of the ways is to have an object that has a resistance and the control this resistance and program it by some means. One just need to set the resistance once. Once the resistance is set, the device cannot learn anymore, but the device can recognize things. For example, if there is a car and it is desired that the camera in the car recognize a stop sign, then it is necessary for the recognition be performed only once. It is desired that the car learns the stop sign. Therefore, the car must be either told or instructed accordingly. This is called inferencing. This kind of network with inferencing just states that yes this is a stop sign or no it is not a stop sign. It is simpler to make those changes, since one just has to set the resistance once.

A feature is the present invention is a method of how one can set the resistance of a piece of Silicon. The way one can set the resistance in computer chips, is that Silicon has a fairly high resistance, but if one shoots foreign atoms (e.g., ion bombardment) into the Silicon, e.g., Boron or Phosphorous, then one can change the conductivity or resistance of the Silicon. The amount of Boron or Phosphorous changes the resistivity accordingly.

One can set the resistance of relatively large areas of the surface, but, if there are two pieces of Silicon that are close together, e.g., less than a micron, it is very hard to use ion bombardment to change the resistance of the particular area independently because there is no spatial resolution. The present invention provides a way to provide the dopant atoms, the Phosphorous or Boron, using a different method than shooting the dopant into the Silicon.

The method is to take a surface and to put down a very precise amount of self-assembled monolayers (SAMs) and that is a special chemistry that limits itself to one layer of molecules and packed with a certain density. The virtue of the self-assembled monolayer is that each one of the SAMs may have a Boron atoms or Phosphorous atoms, they pack, on the surface of one layer, a known density. Therefore, there is a very precise number of Borons or Phosphorous atoms. Other types of atoms could also be used.

Therefore, it can be seen that programming the resistances in artificial neural networks (ANNs) is a very difficult task. The present invention describes several methods that enable the precise programming of resistances by changing the resistivity of semiconductor elements via doping. One of the features of the present invention is the ability to program individual resistive elements efficiently. The methods disclosed allows for placement of controlled amounts of dopants for each cross point element.

As mentioned, there has been electronic devices used for artificial neural networks, but there has been no use of electrochemical devices used in such networks.

The present invention describes methods to program the resistance of semiconductor resistive elements (RE's) used as a components in an artificial neural network. In all of the approaches, a thin-film dopant (TFD) layer containing boron or phosphorous is deposited on the RE. The resistive element is encapsulated with an oxide or nitride layer to prevent removal of the dopant thin film. The resistance of the resistive element is programmed by local heating which drives the dopant film into the bulk of the resistive element. The value of the resistance is determined by a combination of: (1) the amount of dopant in the thin film, (2) the duration of the heating, and (3) the temperature of the resistive element.

FIG. 1 illustrates a cross point array 10 of the present invention. Referring to FIG. 1, inferencing requires a network with well-defined resistance for each resistive element 2 at each node 4. The resistive elements 2 shown in the cross-point array 10 can be programmed once for inferencing.

Figure 2:
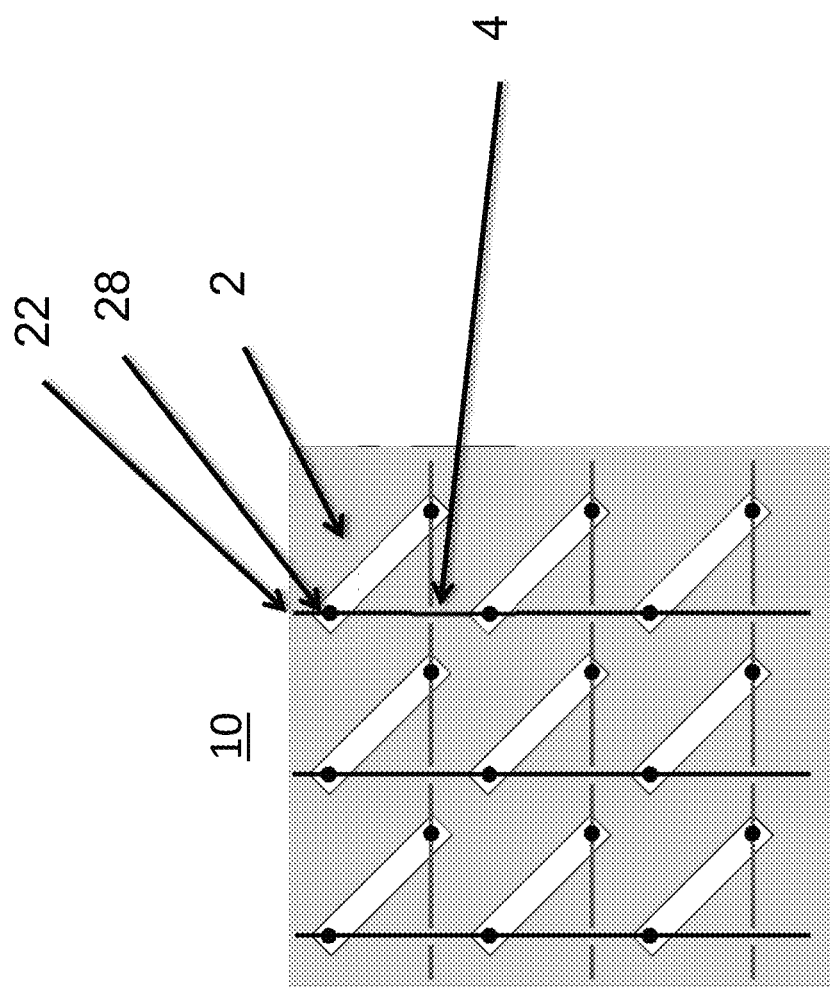
FIG. 2 illustrates another view of the cross point array of the present invention.

FIG. 2 illustrates another view of the cross point array of the present invention. Referring to FIG. 2, another view shows the Silicon on oxide bars (further detailed in FIGS. 3 through 7) forming the resistive elements 2 with contacts 28 on grid 22.

Referring to FIGS. 3 through 7, a simple implementation can be based on doped Si "bars" 30 on oxide (e.g., $SiO_2$) 32, where there is a patterned SOI (Silicon on Insulator) substrate 32. The Si bars 30 can be formed on the $SiO_2$ layer 32. Other types of oxides could be used. The self-assembled dopant monolayer provides for precise density control. The selective desorption allows to "program" resistance at each node 4. As seen further, encapsulation and annealing provides to drive dopants into the Silicon.

Figure 3:
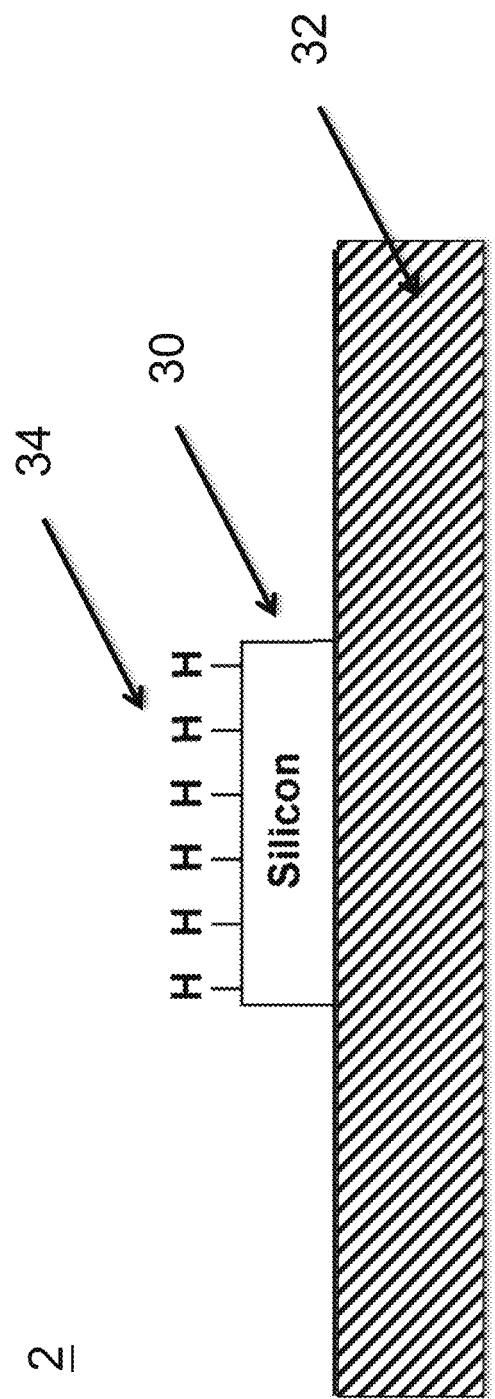
FIG. 3 illustrates a start of the process flow of forming a semiconductor element of an exemplary embodiment.

FIG. 3 illustrates a start of the process flow of forming a semiconductor element such as the resistive element. Referring to FIG. 3, the Silicon bar 30 is terminated with Hydrogen 34. The Silicon 30 is formed on the patterned SOI substrate 32.

Figure 4:
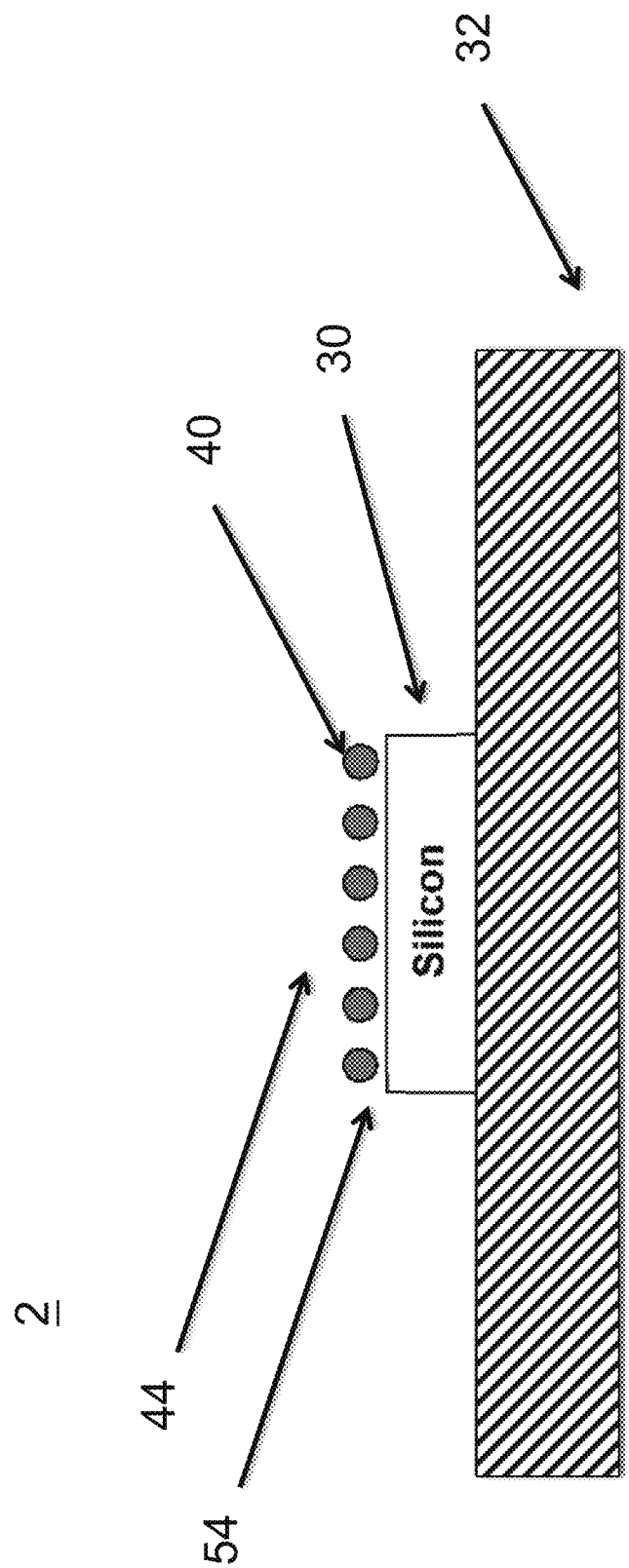
FIG. 4 illustrates a Boron or Phosphorus layer self assembling of the exemplary embodiment.

FIG. 4 illustrates a Boron layer self assembling. Referring to FIG. 4, the Boron or Phosphorus 40, from the thin-film dopant (TFD) layer 44, self-assembles on the Silicon layer 30 to form the SAM (self-assembled monolayer) 54. In the beginning there can be more Borons or Phosphorus than is desired. In the manufacture, there can be a plurality of Silicon bars 30 surrounded by Oxide 32 where the Boron or Phosphorus 40 covers the whole area, but the Boron or Phosphorus 40 will stick only to the Silicon layer 30. Therefore, a thin-film dopant (TFD) layer 44 containing boron or phosphorous 40 is deposited on the resistive element RE 2.

Figure 5:
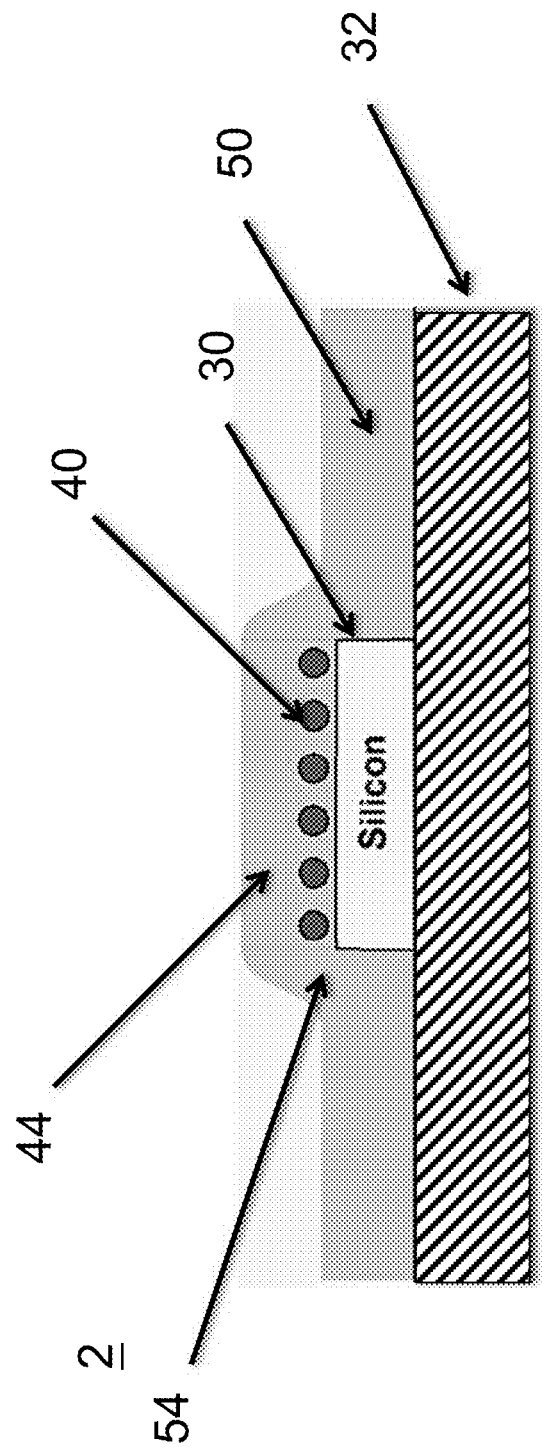
FIG. 5 illustrates and encapsulation step of the exemplary embodiment.

FIG. 5 illustrates the next step of encapsulation. The oxide layer 32 is encapsulated using, for example, atomic layer deposition (ALD) to prevent desorption. Other methods to encapsulate the oxide layer 32 can be used. The encapsulation layer 50 can be formed over the Silicon 30 and Oxide layer 32, and Boron or Phosphorus 40, thus encapsulating the Boron or Phosphorus 40. The resistive element 2 is encapsulated with the encapsulation layer, which can include an oxide or nitride layer to prevent removal of the dopant thin film 44.

Figure 6:
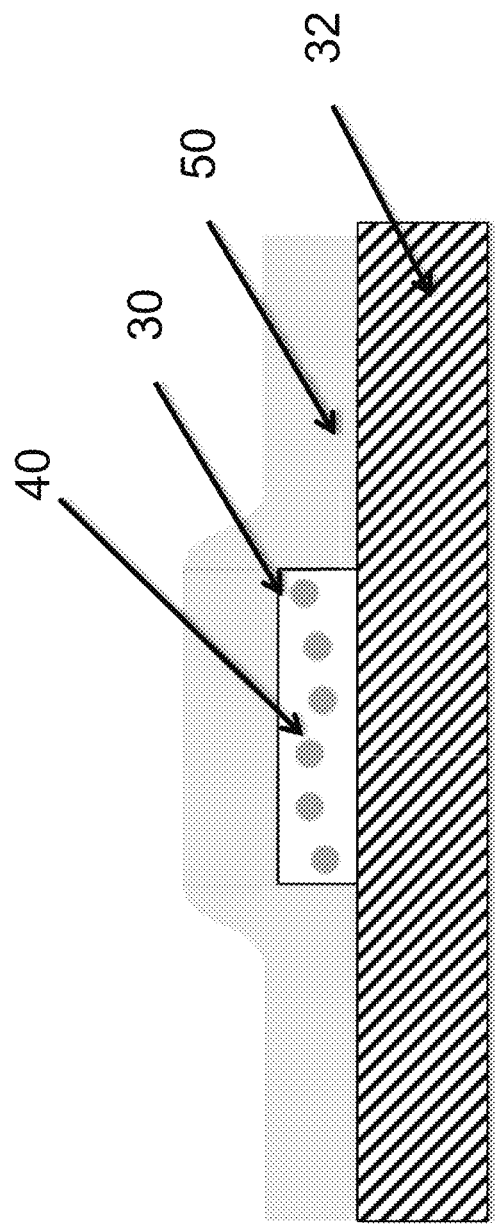
FIG. 6 illustrates an annealing step of the exemplary embodiment.

FIG. 6 illustrates an annealing step. The resistive element 2 is annealed to a temperature range of around 500-1000° C. to drive in dopant, such as the Boron 40 into the Silicon bars 30. Specifically, the resistive element 2 is heated a temperature range of around 500-1000° C. and then slowly cooled down. Other temperature ranges of annealing can be used and modified according to the materials.

The resistance of the resistive element 2 is programmed by local heating which drives the dopant film 44 into the bulk of the resistive element 2 as seen in the Boron or Phosphorus being driven into the Silicon layer 30. The value of the resistance is determined by a combination of: (1) the amount of dopant 40 in the thin film 44, (2) the duration of the heating, and (3) the temperature of the resistive element 2.

Figure 7:
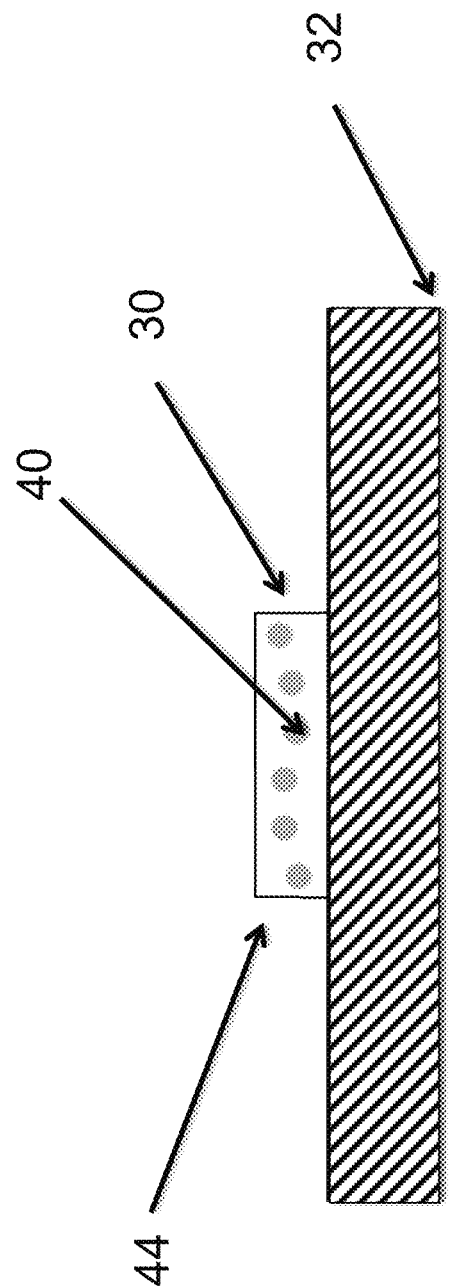
FIG. 7 illustrates a removal step of the exemplary embodiment.

FIG. 7 illustrates an optional removal step. The encapsulation layer 50 is optionally removed from covering the Oxide 32 and the Silicon layer 30.

Programming the resistance at each node is further explained as follows.

The process as shown in FIGS. 3 through 7 then allows all the different semiconductor resistive elements 2 to all have exactly the same density and are very reproducible. The SAM (self-aligned monolayer) 54 provides the same density and length, where the Boron or Phosphorus 40 self assembles on the Silicon layer 30.

Therefore, referring back to FIG. 4, since all the SAM layers 54 are the same, the SAM layers 54 can be made different when it is illuminated with light, for example, shining an electron beam or UV (Ultraviolet) light, one can get some of these Boron or Phosphorus 40 atoms to desorb or in essence go away. For example, if one adds one second there of the light, or two seconds at a different location of light, one can program the coverage.

The SAM layers 54 can be, for example, illuminated with light in order to provide the proper spatial resolution (affecting one area and not another). The electron beam has no problem getting the spatial resolution to zap the Boron or Phosphorus atoms 40 individually. UV light can be used, since one can mask a certain area and shoot the UV light all at once. With an electrical beam one may have to serially done one after another.

Figure 8:
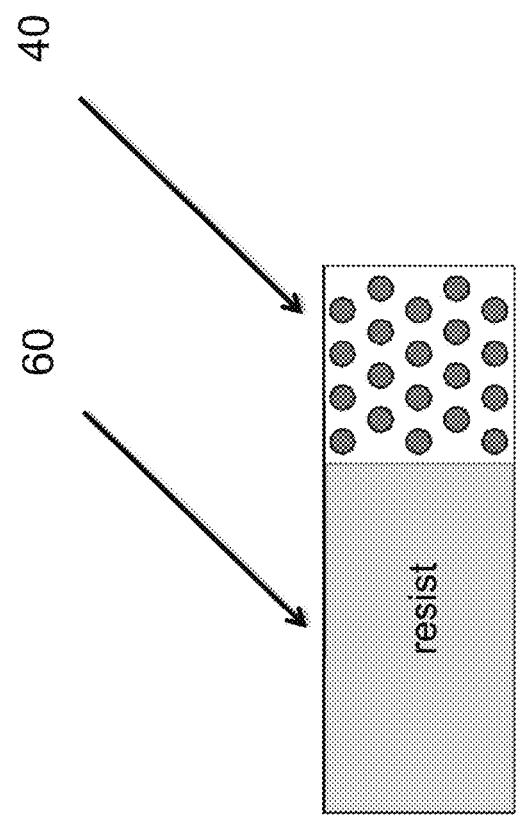
FIG. 8 illustrates the Boron or Phosphorus formation of an exemplary embodiment.

FIG. 8 illustrates the Boron or Phosphorus formation of an exemplary embodiment. Referring to FIG. 8, the Boron or Phosphorous atoms 40 are shown to be formed on the resist 60.

Figure 9:
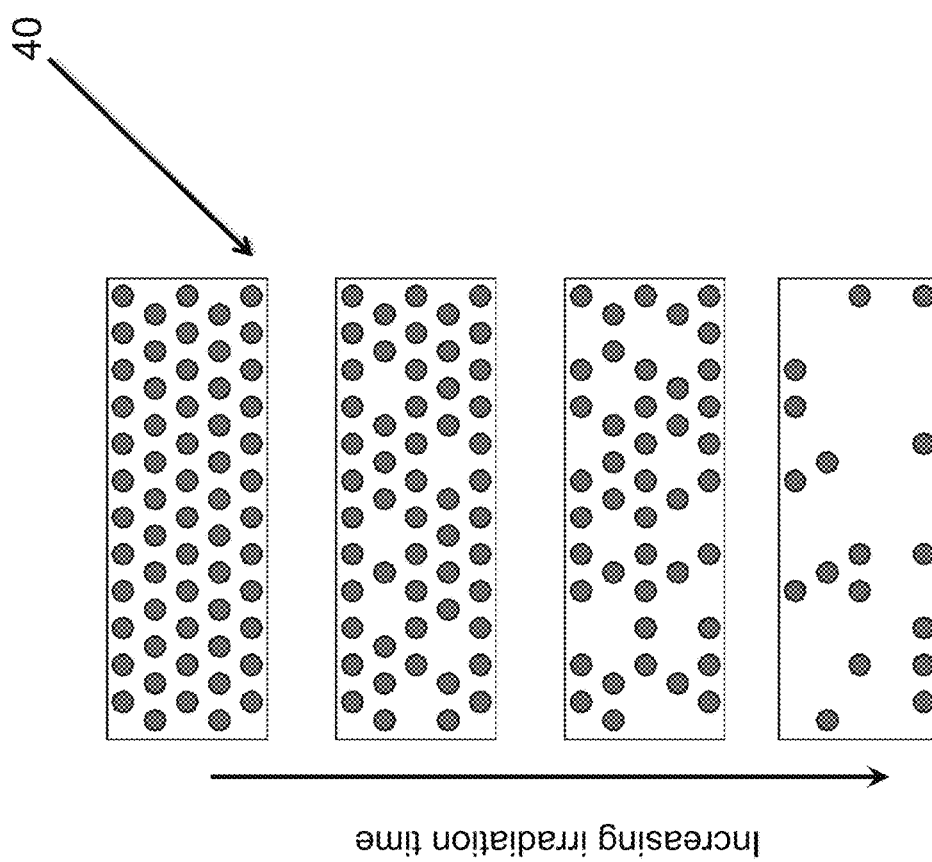
FIG. 9 illustrates a control of the density of Boron or Phosphorus atoms.

FIG. 9 illustrates a control of the density of Boron or Phosphorus atoms. Referring to FIG. 9, it can be seen that with increasing irradiation time, the Boron or Phosphorous atoms 40 are reduced, thus allowing for control of the density.

Then after removing some of Boron or Phosphorus atoms 40 by electron beam or UV light, there is now the Boron or Phosphorus atoms on top of the surface of the Silicon substrate 30.

Then it is preferable to get the Boron or Phosphorous atoms 40 into the Silicon 30, and one cannot just heat because the Boron or Phosphorous atoms 40 can "fly away". Therefore, referring to FIG. 5, it is preferable to do the encapsulation and grow an encapsulation layer 50 on top of the SAM 54. The encapsulation layer 50 can be an oxide or other various oxides.

Referring to FIG. 6. when the resistive element 2 is heated, the Boron or Phosphorus will not go into the oxide 32, but go into the Silicon 30 and change the resistance when the resistive element 2 is annealed. Referring to FIG. 7, then if it is desired, one can optionally strip the encapsulation afterwards. Then the resistive element 2 has a certain amount of Boron or Phosphorus atoms 40 in a certain area.

Referring to FIG. 4, the SAM layers 44 can be, for example, heated. However, the heating should be performed with a certain scheme to provide certain spatial resolution, since heating by itself of an entire surface does not provide the proper spatial resolution (heat this area without heating the other area).

The Self-assembled monolayers 44 have a precise areal density (such as ~$10^{15}$ molecules/cm$^2$). The electron beam irradiation (such as ~5 eV) induces partial desorption (desorption demonstrated for similar monolayers). There is provided a step through array and apply pre-defined dose to each node 4 of the array 10. Other methods of controlling the resistance are also possible, such as light, heat, or lithography.

Figure 10:
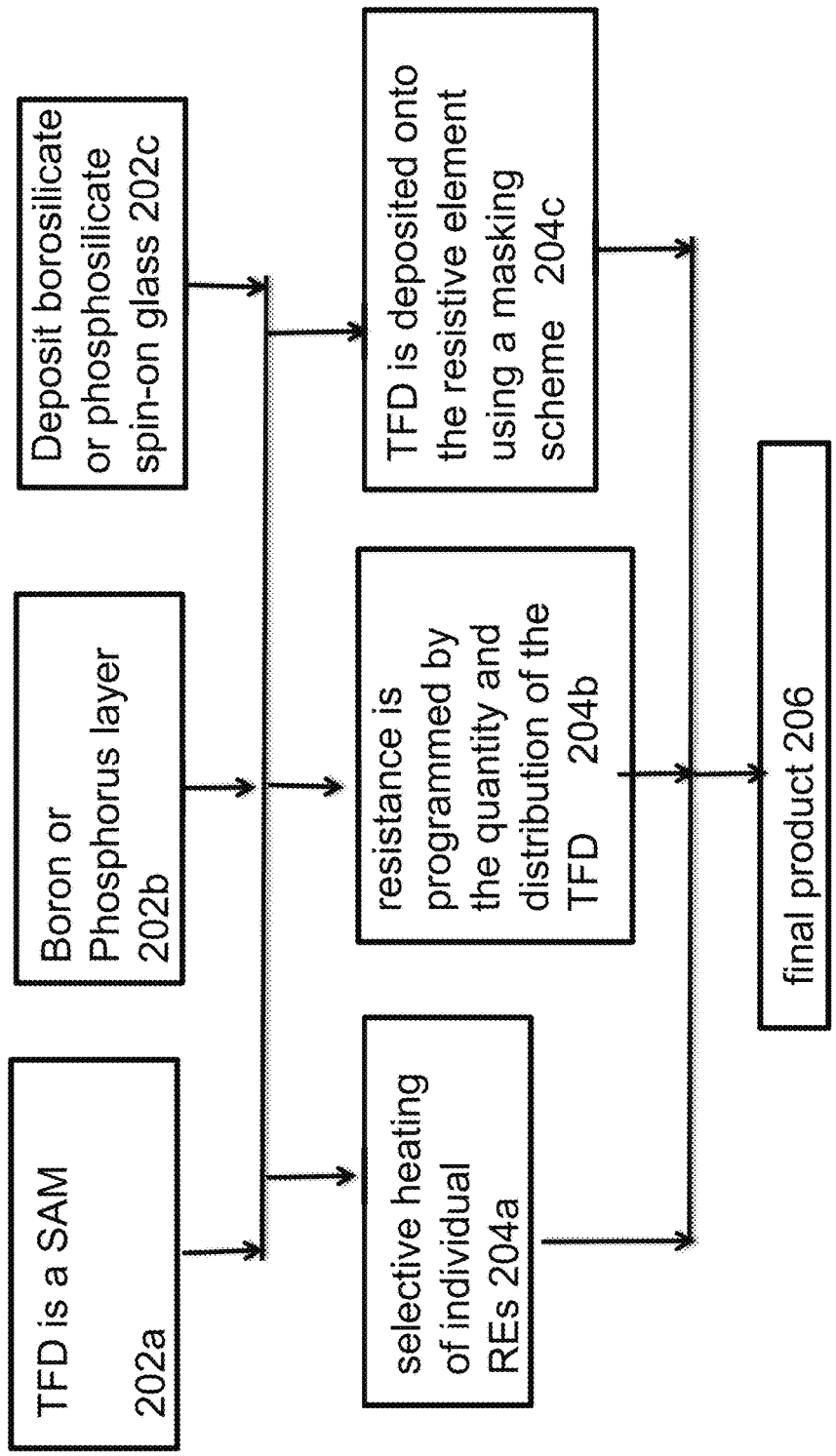
FIG. 10 illustrates the method steps of a plurality of exemplary embodiments.

FIG. 10 illustrates the method steps of a plurality of exemplary embodiments. The following are different alternatives to the present invention. Referring to FIG. 10 and FIG. 4, in one embodiment, in step 202, the thin-film dopant (TFD) 44 containing Boron or Phosphorous 40 self-assembles selectively on bare Silicon 30 to provide a self-assembled mono-layer (SAM) 54. Examples are shown in FIGS. 11A through 11C.

Figure 11A:
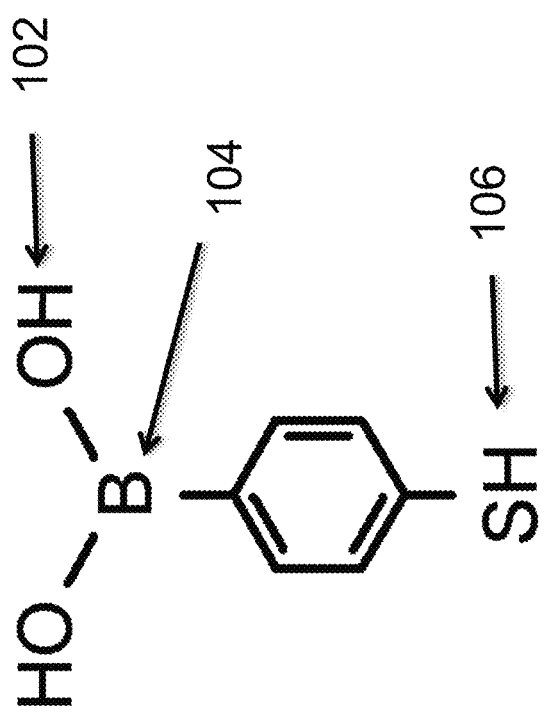
FIG. 11A illustrates an example self-assembled monolayer of an exemplary embodiment.

FIG. 11A illustrates an example self-assembled monolayer 54 of 4-mercaptophenylboronic acid. As shown, the OH at point 102 enables ALD (Atomic Layer Deposition) oxide growth. At point 104, the bulk dopant of Boron is provided. At point 106, SH selectively binds to H—Si.

Figure 11B:
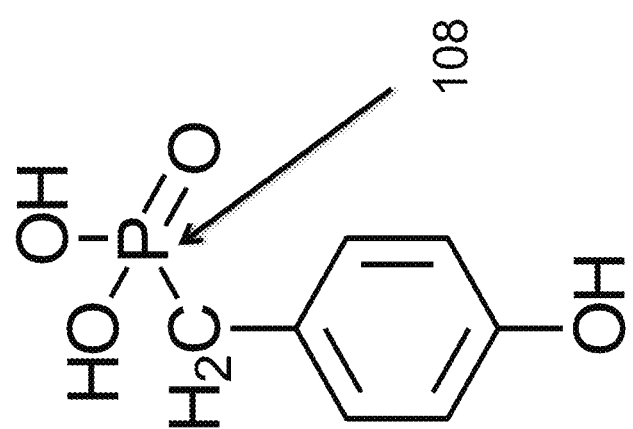
FIG. 11B illustrates another example self-assembled monolayer of an exemplary embodiment.
Figure 11C:
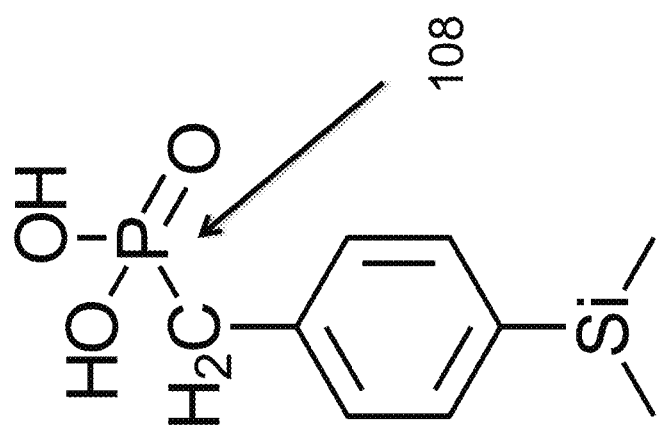
FIG. 11C illustrates yet another example self-assembled monolayer of an exemplary embodiment.

FIG. 11B illustrates an example self-assembled monolayer 54 with Phosphorus as the bulk dopant 40 as seen in point 108. FIG. 11C illustrates another example self-assembled monolayer 54 with Phosphorus as the bulk dopant 40 as seen in point 108.

Figure 12:
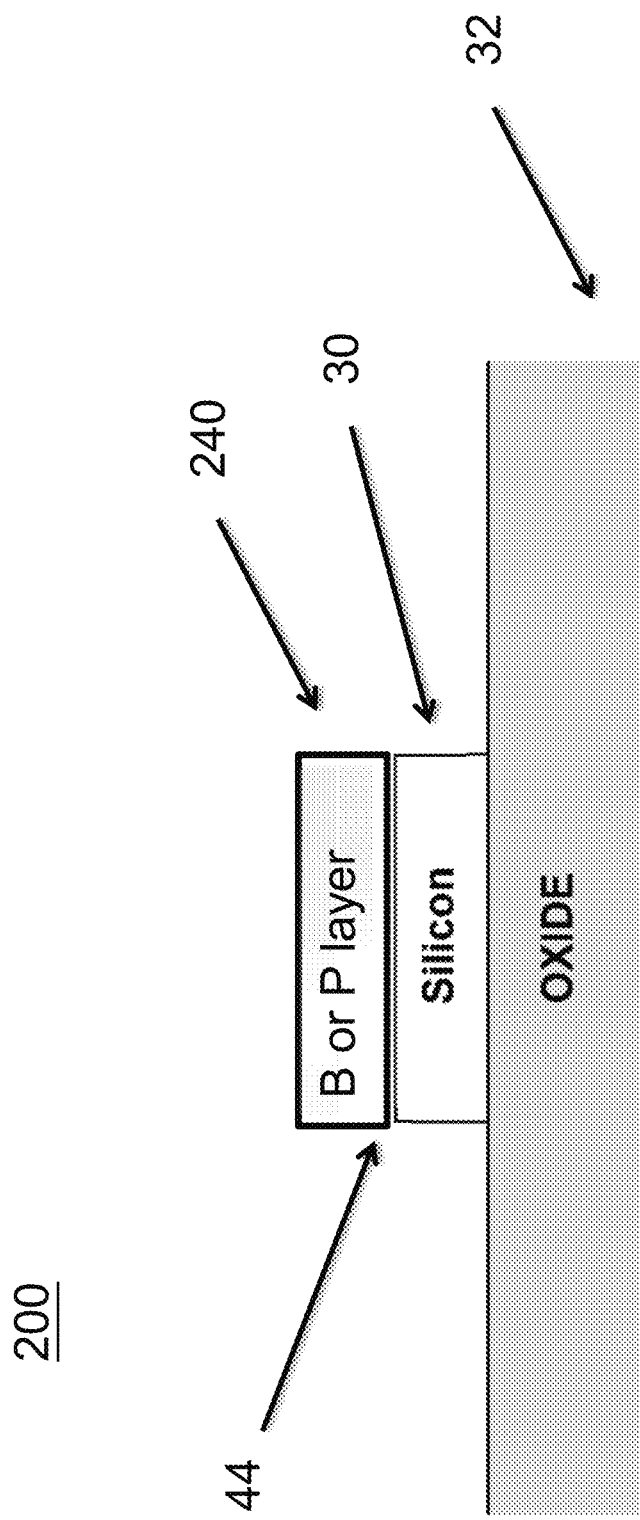
FIG. 12 illustrates Boron or Phosphorus layer in another exemplary embodiment.

Referring FIG. 10 and FIG. 12, in another embodiment, the thin-film dopant (TFD) is a Boron or Phosphorus layer 240 deposited using conventional means, such as ALD (Atomic Layer Deposition), MBE (Molecular Beam Epitaxy), or CVD (Chemical Vapor Deposition) as seen in alternative step 202b in order to form the resistive element 200.

Figure 13:
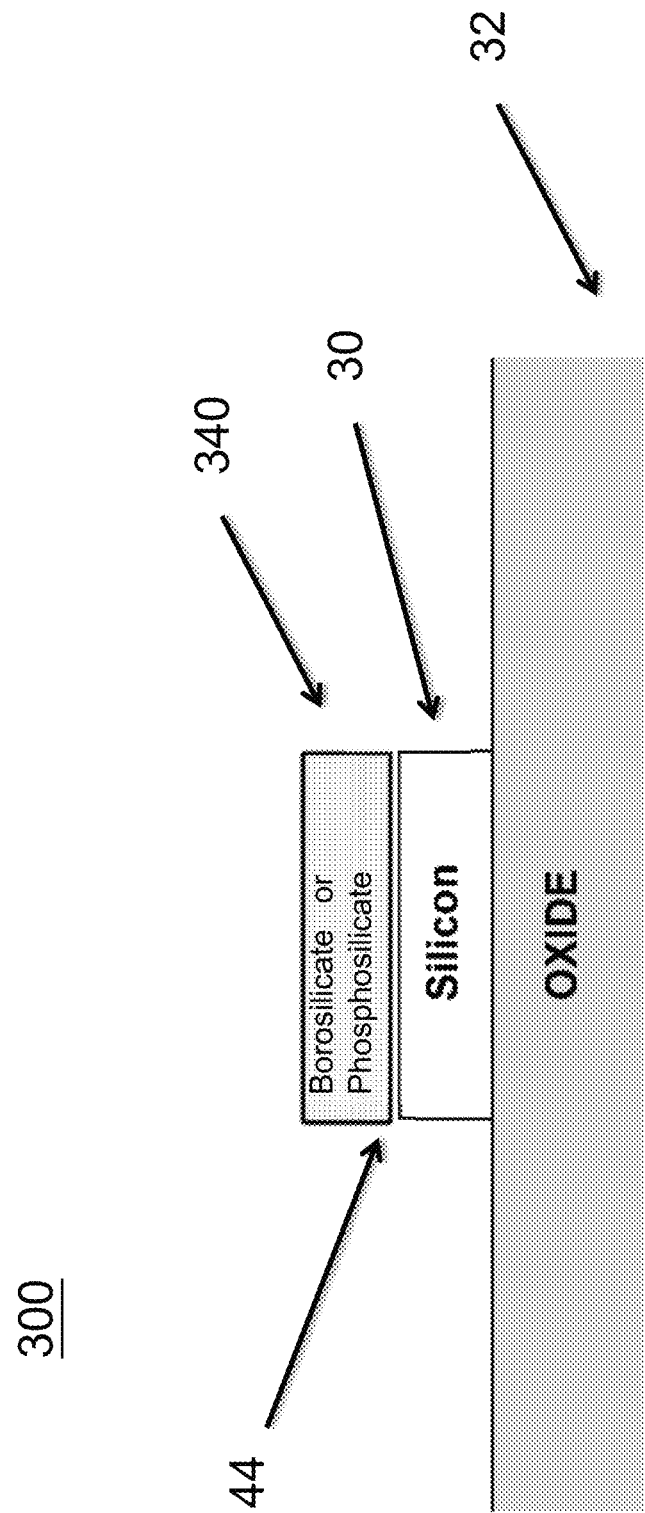
FIG. 13 illustrates depositing of Borosilicate or Phosphosilicate in another exemplary embodiment.

In another embodiment, referring to FIGS. 10 and 13, the thin film dopant is a Boron or Phosphorus layer 340 deposited as borosilicate or phosphosilicate spin-on glass in alternative first step 202c in order to form the resistive element 300.

Referring back to FIG. 1, the controlled amounts of dopants can be placed for each cross point element 2 in the array 10.

In another embodiment, in the next phase from steps 202a, 202b, or 202c, the resistance is programmed by selective heating of individual resistive elements (RE's) 2 while the resistance is monitored as seen in step 204a. In this approach each resistive element 2 is coated with an identical TFD and time and temperature of the heating are used to set the resistance.

In yet another embodiment, the resistance is programmed by the quantity and distribution of the TFD 40, which can vary from resistive element 2 to resistive element 2. The TFD 40 is deposited uniformly on all the resistive elements 2 and then is selectively ablated or desorbed from individual resistive elements in the alternative step 204b. The resistive elements are encapsulated and heated uniformly.

Figure 14:
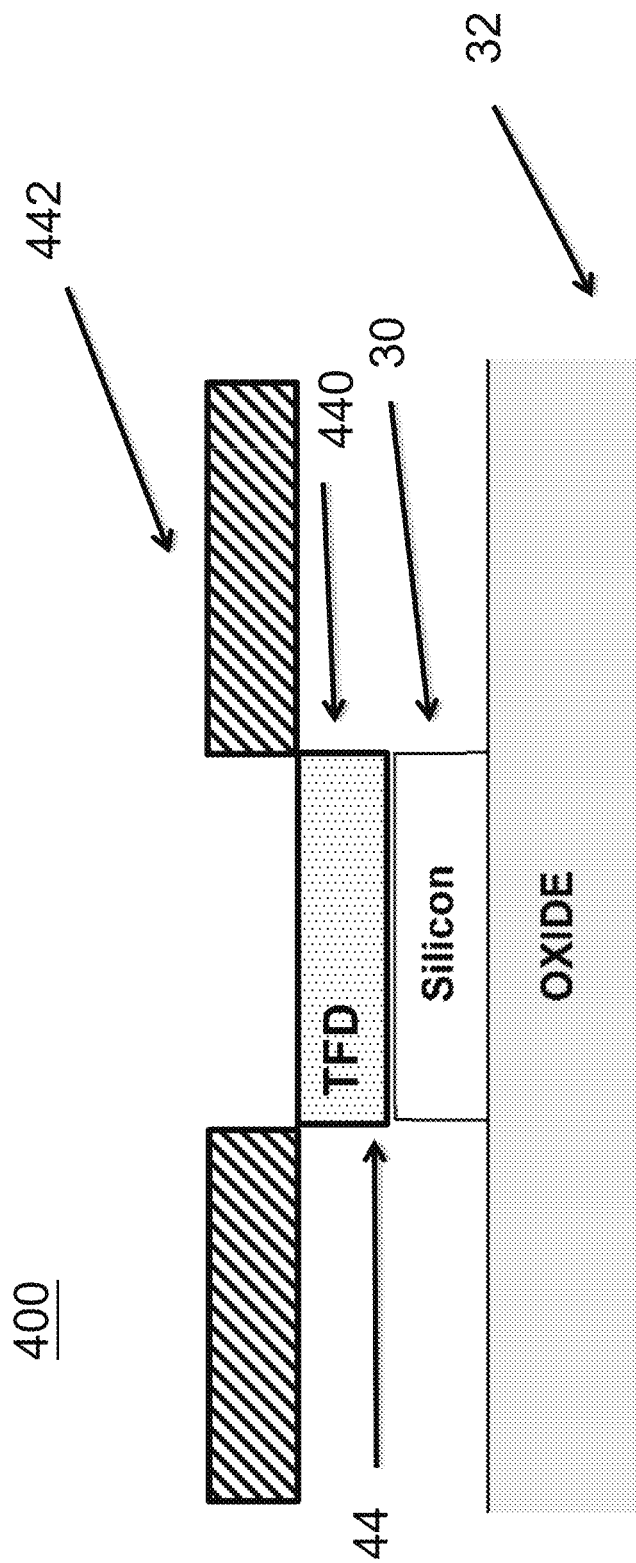
FIG. 14 illustrates depositing TFD using a masking scheme in another exemplary embodiment.

In still another embodiment, referring to FIGS. 10 and 14, the resistance is programmed by the quantity and distribution of the TFD 440, which can vary from resistive element 400 to resistive element 400. The TFD 440 is deposited onto the resistive element using a masking scheme which determines the distribution of the TFD 240 on each resistive element in alternative step 204c. The masks 442 are used to determine the distribution of the TFD 440.

Then, referring to FIG. 10, the resistive elements RE are encapsulated in step 206 and heated uniformly in an annealing step 208. Finally, an option step of removing the encapsulation is performed in step 210.

The final product can then be made 206 by repeating or performing in parallel the above alternative steps for each of each cross point element 2 in the array 10. Additionally, encapsulation (See FIG. 5), annealing (See FIG. 6) and removal of encapsulation (See FIG. 7) can be performed for each cross point element.

Therefore, as shown above, the present invention described several methods that enable the precise programming of resistances by changing the resistivity of semiconductor elements via doping. The present invention has the ability to program individual elements efficiently.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention. The different methods allow the placement of controlled amounts of dopants for each cross point element which can be further modified.

It is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

What is claimed is:

1. A method of forming semiconductor elements in an artificial neural network, the method comprising:
    forming a substrate comprising an oxide layer;
    forming a Silicon layer on the oxide layer;
    depositing a thin film dopant layer on the Silicon layer; and
    controlling a concentration of the dopant in the thin film dopant layer to form the semiconductor elements in the artificial neural network.

2. The method according to claim 1, wherein the thin film dopant layer includes at least one element from a group of Boron and Phosphorus.

3. The method according to claim 1, further comprising forming a self-assembled monolayer from the thin film dopant layer and the Silicon layer.

4. The method according to claim 3, wherein the self-assembled monolayer comprises at least one of Boron and Phosphorus.

5. The method according to claim 1, wherein the thin film dopant layer comprises borosilicate or phosphosilicate spin on glass.

6. The method according to claim 1, wherein a resistance of the semiconductor elements are set according to the controlling of the concentration of the dopant by a use of an electron beam or ultraviolet light on the thin film dopant layer.

7. The method according to claim 1, further comprising selectively heating of the semiconductor elements from among a plurality of semiconductor elements formed in an array.

8. The method according to claim 1, wherein the controlling programs the resistance of a plurality of the semiconductor elements by quantity and distribution of the thin film dopant layer.

9. The method according to claim 1, wherein the thin film dopant layer is deposited using a masking scheme.

10. The method according to claim 1, wherein the controlling includes the resistance of individual elements being tuned by uniform heating to drive the dopants into the individual resistive elements.

11. The method according to claim 1, further comprising encapsulating the thin film dopant layer with an encapsulating layer comprising an oxide or nitride.

12. The method according to claim 11, further comprising annealing the encapsulated thin film dopant layer.

13. The method according to claim 12, further comprising removing the encapsulating layer.

14. A method of forming resistive elements, the method comprising:
    forming a plurality of resistive elements in an array, each of the resistive element formed by a method comprising:
        forming a Silicon layer on an oxide layer;
        depositing a thin film dopant layer on a Silicon layer; and
        controlling a concentration of the dopant in the thin film dopant layer to form the resistive elements in an artificial neural network.

15. The method according to claim 14, wherein the thin film dopant layer includes at least one of Boron and Phosphorus.

16. The method according to claim 1, wherein the thin film dopant layer includes a predetermined amount of dopant including at least one of Boron and Phosphorus.

17. The method according to claim 1, wherein the controlling of the concentration further comprises self-assembling the Boron or Phosphorus, from the thin film dopant layer, on the Silicon layer to form a self-assembled monolayer (SAM).

18. The resistive element according to claim 1, further comprising forming an encapsulating layer including an oxide or a nitride encapsulating the Silicon layer.

19. A method of forming a resistive element, the method comprising:
    forming an oxide layer;
    forming a Silicon layer on the oxide layer;
    depositing a thin film dopant layer on the Silicon layer; and
    controlling a concentration of the dopant in the thin film dopant layer to form the resistive element in an artificial neural network.

20. The method according to claim 19, wherein the thin film dopant layer includes at least one element from a group of Boron and Phosphorus, and
    wherein the controlling the concentration further comprising self-assembling the Boron or Phosphorus, from the thin film dopant layer, on the Silicon layer to form a self-assembled monolayer (SAM) limited to a single layer.

* * * * *